(12) United States Patent
Rockenfeller

(10) Patent No.: US 8,302,416 B2
(45) Date of Patent: Nov. 6, 2012

(54) LIQUID REFRIGERANT COMPOSITE COOLING SYSTEM

(75) Inventor: Uwe Rockenfeller, Boulder City, NV (US)

(73) Assignee: Rocky Research, Boulder City, NV (US)

( * ) Notice: Subject to any disclaimer, the term of this patent is extended or adjusted under 35 U.S.C. 154(b) by 919 days.

(21) Appl. No.: 12/396,365

(22) Filed: Mar. 2, 2009

(65) Prior Publication Data

US 2010/0218511 A1   Sep. 2, 2010

(51) Int. Cl.
F25B 27/00 (2006.01)
(52) U.S. Cl. .......................... 62/238.3; 62/476
(58) Field of Classification Search .......... 62/3.1, 62/238.3, 476, 101
See application file for complete search history.

(56) References Cited

U.S. PATENT DOCUMENTS

| | | | |
|---|---|---|---|
| 3,424,916 A | 1/1969 | Fenley | |
| 4,006,603 A | 2/1977 | Miles | |
| 4,340,823 A | 7/1982 | Miyazawa | |
| 4,665,707 A | 5/1987 | Hamilton | |
| 4,694,236 A | 9/1987 | Upadhyay et al. | |
| 5,874,788 A | 2/1999 | Mccartney | |
| 5,929,538 A | 7/1999 | O'Sullivan et al. | |
| 5,977,659 A | 11/1999 | Takehara et al. | |
| 6,005,362 A | 12/1999 | Enjeti et al. | |
| 6,094,034 A | 7/2000 | Matsuura | |
| 6,103,280 A | 8/2000 | Molzahn et al. | |
| 6,242,883 B1 | 6/2001 | Strunk | |
| 6,257,007 B1 | 7/2001 | Hartman | |
| 6,316,895 B1 | 11/2001 | Ramarathnam | |
| 6,471,013 B2 | 10/2002 | Banno et al. | |
| 6,639,373 B2 | 10/2003 | Knight et al. | |
| 6,847,130 B1 | 1/2005 | Belehradek et al. | |
| 7,151,328 B2 | 12/2006 | Bolz et al. | |
| 7,332,885 B2 | 2/2008 | Schnetzka et al. | |
| 2002/0073726 A1 | 6/2002 | Hasebee et al. | |
| 2002/0189279 A1 | 12/2002 | Pfister et al. | |
| 2003/0048006 A1 | 3/2003 | Shelter, Jr. et al. | |
| 2004/0040328 A1* | 3/2004 | Patel et al. ............. | 62/259.2 |
| 2004/0245949 A1 | 12/2004 | Ueda et al. | |
| 2006/0103342 A1 | 5/2006 | Mechi | |
| 2006/0147710 A1 | 7/2006 | Rockenfeller | |

(Continued)

FOREIGN PATENT DOCUMENTS

EP     901218 A2    3/1999

(Continued)

OTHER PUBLICATIONS

Buchholz, G., Energy Efficiency Improvements in Commercial Cooling Applications. Sanken Technical Report, vol. 34, No. 1, p. 47-50, Sanken Electric Co., (2002).

(Continued)

Primary Examiner — Melvin Jones
(74) Attorney, Agent, or Firm — Knobbe Martens Olson & Bear, LLP

(57) ABSTRACT

A system for cooling components comprises a composite of a sponge or sponge-like material with liquid refrigerant absorbed thereon and encased in a containment material configured to rupture or otherwise release evaporating refrigerant when internal composite pressure reaches a threshold ΔP from the outside pressure and/or at a pre-selected composite temperature, and thermal conduction means in thermal contact with the composite and one or more components for directing thermal energy to cool the components.

11 Claims, 1 Drawing Sheet

U.S. PATENT DOCUMENTS

| | | | |
|---|---|---|---|
| 2006/0208687 | A1 | 9/2006 | Takeoka et al. |
| 2007/0114962 | A1 | 5/2007 | Grbovic |

FOREIGN PATENT DOCUMENTS

| | | | |
|---|---|---|---|
| EP | 1057236 | B1 | 4/2004 |
| GB | 1287648 | A | 9/1972 |
| GB | 2354378 | A | 3/2001 |
| JP | 04-364372 | A | 12/1992 |
| JP | 05-157330 | A | 6/1993 |
| JP | 05-324106 | A | 7/1993 |
| JP | 52-76690 | A | 10/1993 |
| JP | 72-39672 | A | 9/1995 |
| JP | 09-168299 | A | 6/1997 |
| JP | 2005-210869 | A | 8/2005 |
| JP | 2008-048568 | A | 2/2008 |
| WO | WO 98/02695 | A2 | 1/1998 |
| WO | WO 2005/020407 | A2 | 3/2005 |

OTHER PUBLICATIONS

Holtz et al., A High-Power Multitransistor-Inverter Uninterruptable Power Supply System; Power Electronics, IEEE Transactions, vol. 3 (3), p. 278-285, (Jul. 1988).

Mallinson, N. "Plug and Play" Single Chip Controllers for Variable Speed Induction Motor Drives in White Goods and HVAC Systems. Motion Control & Power Conditioning Products, GEC Plessey Semicond., Oldham, UK Conference: APEC '98. Thirteenth Annual Applied Power Electronics Conference and Exposition (Cat. No. 98CH36154) Part: vol. 2, p. 756-62 vol. 2 Publisher: IEEE, New York, NY (1998).

Manz, L. Applying Adjustable Speed Drives (ASDs) to 3 Phase Induction NEMA Frame Motors; IEEE/PCA Cement Industry Technical Conference, p. 71-8 IEEE, New York, NY, USA (1996).

Matsui et al., Improvement of Transient Response of Thermal Power Plant Using VVVF Inverter. Japan Conference: 2007 International Conference on Power Electronics and Drive Systems (PEDS '07), p. 1209-1214; IEEE, Piscataway, NJ, USA, 2007.

Meenakshi et al., Intelligent Controller for a Stand-Alone Hybrid Generation System; Power India Conference, 2006 IEEE; p. 8 (Apr. 2006).

Muntean et al., Variable Speed Drive Structures and Benefits in Cooling Tower Fans Applications; Dept. of Electr. Eng., Univ. Politehnica of Timisoara, Romania WSEAS Transactions on Systems, vol. 6 (4), p. 766-71 (Apr. 2007).

Nelson et al., Basics and Advances in Battery Systems. Industry Applications. IEEE Transactions, vol. 31(2), p. 419-428 (Mar./Apr. 1995).

Prest et al., Development of a Three-Phase Variable Speed Drive System for a Battery Fed Underground Mining Locomotive; Power Electronics and Variable-Speed Drives, Third International Conference on vol. 13 (15), p. 233-236 (Jul. 1988).

Stefanovic, V. R., Adjustable Speed Drives: Applications and R&D Needs. Oak Ridge National Lab., TN. Sponsor: Department of Energy, Washington, DC. Report No. ORNL/SUB-80-SN772, p. 86 (1995).

Sukumara et al., Fuel Cell Based Uninterrupted Power Sources; Power Electronics and Drive Systems; International Conference; p. 728-733 vol. 2 (May 1997).

Suryawanshi et al., High Power Factor Operation of a Three-Phase Rectifier for an Adjustable-Speed Drive. IEEE Transactions on Industrial Electronics, vol. 55 (4), p. 1637-46 (Apr. 2008).

Thoegersen et al., Adjustable Speed Drives in the Next Decade: Future Steps in Industry and Academia Aalborg University Institute of Energy Technology Aalborg East, DK-9220 Denmark Electric Power Components and Systems vol. 32 (1), p. 13-31 (2004).

Tolbert et al., A Bi-Directional DC-DC Converter with Minimum Energy Storage Elements; Industry Applications Conference, 2002. 37th IAS Annual Meeting. Conference; p. 572-1577 vol. 3 (Oct. 2002).

Tracy et al., Achieving High Efficiency in a Double Conversion Transformerless UPS; Industrial Electronics Society, IECON 2005. 31st Annual Conference of IEEE; p. 4 (Nov. 2005).

Welchko et al., A Novel Variable Frequency Three-Phase Induction Motor Drive System Using Only Three Controlled Switches, University of Wisconsin-Madison, Center for Power Electronics Systems (CPES) p. 1468-1473 (2000).

Yang, et al., An improved assessment model of variable frequency-driven direct expansion air-conditioning system in commercial buildings for Taiwan green building rating system, ScienceDirect, Building and Environment 42 (2007) 3582-3588.

Yuan et al., Integrated Uninterruptible DC Converter with Low Input Distortion and Wide Regulation Capability; Power Electronics and Variable-Speed Drives, p. 638-644 (1994).

Zhan et al., Development of a Single-Phase High Frequency UPS with Backup PEM Fuel Cell and Battery; Electrical Machines and Systems, ICEMS. International Conference; p. 1840-1844 (Oct. 2007).

Yanhe et al., "Kinetics of enhanced absorption polarization for organic pollutants on activated carbon fiber", Front. Environmental Science Engineering, 1(1): pp. 83-88, China, 2007.

\* cited by examiner

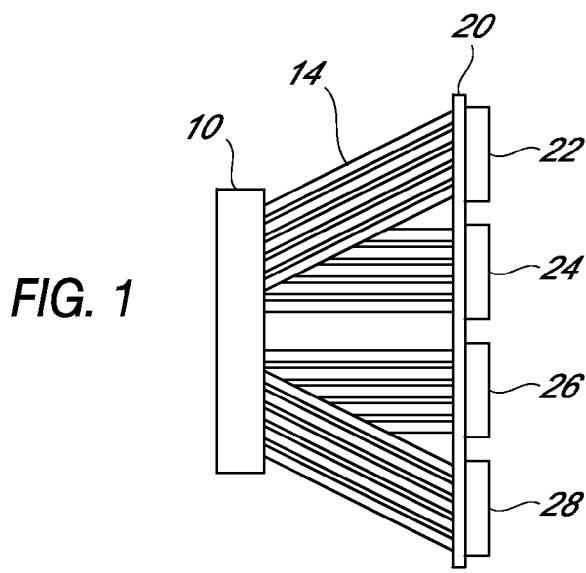
FIG. 1
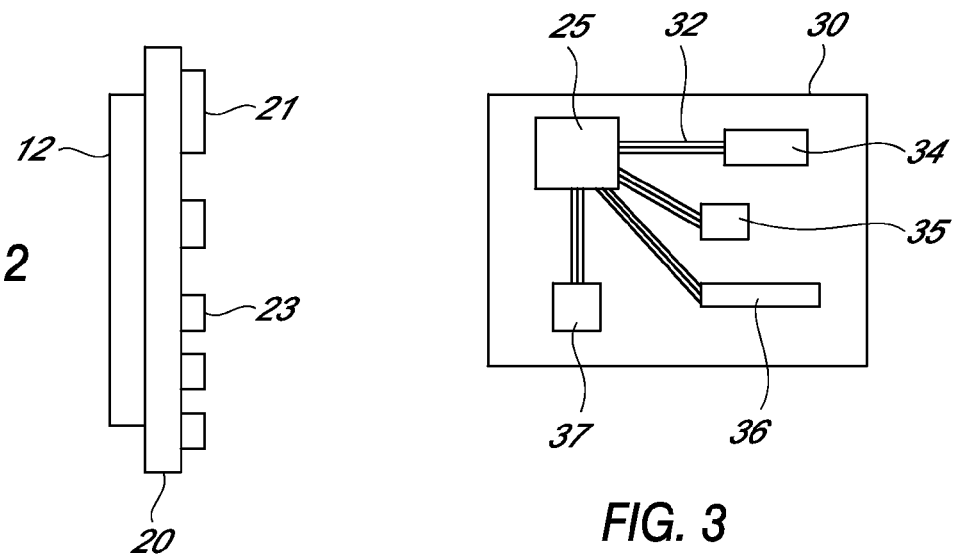
FIG. 2
FIG. 3
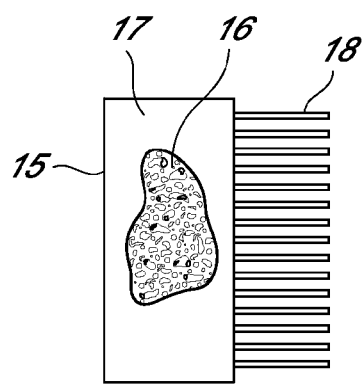
FIG. 4

LIQUID REFRIGERANT COMPOSITE COOLING SYSTEM

BACKGROUND OF THE INVENTION

Cooling of temperature sensitive components such as electronic and computer system components to predetermined temperatures and temperature ranges is important in maintaining component operating efficiency. Such components have critical operating temperature thresholds, above which operating efficiency is reduced, often dramatically, especially as temperatures continue to rise. Microprocessors, memory chips, graphics cards, hard drives, transistors, power supplies and/or other computer electronic components used in vehicles or in guidance systems of missiles, rockets, smart bombs or unmanned attack or surveillance equipment may not be cooled by conventional heat exchangers or cooling systems. The system described herein may be used to provide effective cooling of such temperature sensitive components and is especially suitable where recharging of the composite for continued cooling output is not required.

SUMMARY OF THE INVENTION

One embodiment is a cooling system comprising a liquid refrigerant containment composite configured to release evaporating refrigerant at system temperatures at or above a pre-determined trigger temperature, a sealant material encasing the composite and configured to rupture and/or enable release of refrigerant evaporating from the composite when the internal composite pressure reaches a threshold pressure differential ($\Delta P$) from the pressure outside of the system, and thermal conduction means in thermal contact with the system and one or more temperature sensitive components for directing cooling from the system to the temperature sensitive components. The system operates in response to heat directed to the composite from one or more temperature sensitive components via the thermal conduction means. As the composite is heated, refrigerant increases internal system pressure. At trigger temperature a threshold $\Delta P$ causes rupture of the sealant and the cooling system releases the evaporating refrigerant. Such refrigerant release produces cooling which is directed to the temperature sensitive components via thermal conductors or by direct contact with the component(s). Also described is a method of cooling a heat sensitive component utilizing the aforesaid composite cooling system and thermal conduction components.

BRIEF DESCRIPTION OF THE DRAWINGS

FIG. 1 is a side view of an embodiment showing a composite cooling system and thermal conductors extending from the system to a circuit board with temperature sensitive components mounted thereon;

FIG. 2 illustrates an embodiment with a composite cooling system positioned against a circuit board with mounted temperature sensitive components;

FIG. 3 illustrates an embodiment with the composite cooling system mounted on a circuit board with thermal conductors extending between the system and temperature sensitive electronic components; and FIG. 4 is a side elevational view of a composite cooling system with the containment material partially cut away to expose the sponge/refrigerant composite and showing thermal conductors extending from the system.

DETAILED DESCRIPTION OF PREFERRED EMBODIMENTS

One embodiment is a composite cooling system as described herein. A composite refrigerant containment used in the composite cooling system may comprise a liquid refrigerant such as water, aqueous solutions, alcohols, amines or fluorocarbons, e.g., HFCs, CFCs, HCFCs, absorbed on a sponge or sponge-like material. The specific refrigerant used in the system for any particular components or structures to be cooled will depend on the cooling temperature or temperature ranges desired as well as the atmosphere or exo-atmospheric pressure to which the system is exposed and intended to perform. For pressures of between about 0.5 and about 3 atmospheres and temperatures between about 80° C. and about 200° C. and particularly up to about 150° C. and preferably at or below about 100° C. 125° C. water, aqueous solutions, alcohols, low pressure fluorocarbons and amines are useful and preferred.

In one embodiment, the refrigerant containment composite incorporates a sponge or sponge-like material or component on which the liquid refrigerant is absorbed. Any known sponge material capable of absorbing and holding a significant fraction and preferably a multiple of its weight of liquid refrigerant may be useful, it being understood that the primary purpose of the sponge is to hold the liquid refrigerant in place until evaporative conditions exist.

The sponge or sponge-like material may be organic, including natural sponges, sponge rubber, polyurethane, polyolefins, vinyl nitrile blends, and PVA sponges as well as inorganic materials such as silicones. Thus, practically any cellular sponge capable of absorbing and holding a suitable amount of the desired refrigerant may be used.

The sponge material may also be selected by reference to its cell structure and pore size. Such features may be considered to allow some regulation or control of the rate of liquid refrigerant evaporation once the system has been exposed to conditions and the environment at which evaporation occurs.

The above-described liquid containing sponge composite may be coated or encased in a containment material comprising skin or a shell configured to be ruptured or otherwise release the evaporating refrigerant at one or more pre-selected conditions. Examples of such pre-selected conditions include a trigger temperature, a pressure differential ($\Delta P$) between the pressure inside the unruptured containment composite and the outside pressure, a combination of the aforesaid two conditions, or some force exerted by mechanical or electrical components breaking the containment material. For example, if a containment material is selected to rupture at a certain $\Delta P$, as the composite absorbs heat driving the refrigerant pressurizing and evaporation, the internal composite pressure increases. When the internal pressure reaches threshold $\Delta P$, the containment material ruptures and releases evaporating refrigerant from the system resulting in cooling which is directed to the heat sensitive component(s) to be cooled.

The containment material may also, or instead, be selected to melt or otherwise break or rupture at a pre-selected temperature, thereby releasing refrigerant from the composite. Or, as noted, some other force, electric current, or means may be used to break the sealing containment material at a pre-determined condition or event, e.g., launch, speed, force, etc.

Containment material for encasing the composite may be selected for its ability to rupture and/or enable release of the refrigerant through the material at an aforesaid pre-selected condition. Such materials include wax, shellac or similar natural resins, polymer coatings such as epoxy resin, phenolic resin, neoprene, vinyl polymers including PBC, vinyl acetate or vinyl butyral copolymers, fluroplastics such as polychlorotrifluoroethylene, polytetrafluoroethylene, FEP fluroplastics, polyvinylidene fluoride, chlorinated rubber and the like. Other examples of suitable materials include a thin, porous fluoropolymer membrane which has been coated with urethane, such as used in GORE-TEX®. It is to be understood that the aforesaid containment materials are given by way of example only and the list is not intended to be exhaustive or complete. Again, the containment material and its application (thickness, etc.) must provide for release of the evaporating refrigerant at the pre-selected threshold condition.

In addition to the aforesaid containment sealants, the composite may also incorporate a porous membrane for inducing a pressure drop and controlling evaporation rate, in the event such control is needed, depending on the refrigerant, and the conditions to which the system is exposed and required to operate successfully. Such membranes may also be used where there is a need to avoid expulsion of liquid refrigerant to the components being cooled by the system.

The cooling apparatus assembly may also include a thermal conduction means in the form of metal or other thermal conductors such as rods, struts, arms, shafts, pins, plates, pads, mesh or combinations of two or more of such thermal conductors or their equivalents which are capable of conducting cooling from the composite to a temperature sensitive component. Other examples of useful thermal conductors include heat pipes or thermosyphons.

Referring to FIG. 1, there is illustrated a composite 10, a circuit board 20 on which are mounted temperature sensitive components 22, 24, 26 and 28, and a plurality of thermal conductors 14 which are in thermal contact with the heat sensitive components and the composite. In FIG. 2, composite 12 is positioned against the circuit board 20 with its temperature sensitive components 21 and 23 whereby the composite is in direct thermal contact with the heat sensitive components to be cooled by the composite upon release of refrigerant. In FIG. 3, composite 25 is mounted on the face of circuit board 30, and cooling is directed to heat sensitive electronic components 34, 35, 36, 37 via thermal conductors 32 extending between the composite and the respective components. In FIG. 4, the containment material 17 encasing the composite 16 is partially cut away so as to expose the sponge of the composite. A plurality of thermal conductors 18 are in thermal communication with the composite and configured to direct cooling from the composite to a temperature sensitive component. As the composite is heated, liquid refrigerant is evaporated and the internal composite pressure increases. When the threshold ΔP or composite trigger temperature is reached, the containment material encasing the composite ruptures and vaporizing refrigerant is released. The composite cooling is directed to the temperature sensitive component (s) via the thermal conductors.

Selection of sponge materials and liquid refrigerant and the configuration of the composite including its dimensions may also be selected to provide greater cooling density, depending on the intended use and the environment to which the composite and temperature sensitive components are exposed including anticipated cooling requirements. The thermal conduction means may also be selected to meet the needs and spatial requirements between the composite cooling system and a temperature sensitive component or other device to be cooled, whether such means are by the use of metal or other thermal conducting rods, plates or other components such as heat pipes which allow more or less separation of the composite from the components to be cooled, as compared to the cooling system being in direct thermal or physical contact with the components.

What is claimed is:

1. Apparatus for cooling one or more devices or components comprising:
    a composite configured to release vaporized refrigerant at or above a pre-selected trigger temperature comprising:
        a sponge or sponge-like material and a liquid refrigerant selected from water, aqueous solutions, alcohols, amines or fluorocarbons absorbed thereon,
        a containment material encasing said composite and configured to rupture and/or enable release of evaporated refrigerant therethrough at a preselected trigger temperature, and/or when internal composite pressure reaches a threshold ΔP from the pressure outside said composite or by mechanical or electrical induced force; and
    thermal conduction means in thermal contact with said composite and configured for directing thermal energy between said composite and one or more components or devices.

2. The apparatus of claim 1 wherein said sponge comprises natural sponge, sponge rubber, polyurethane, polyolefin, vinyl nitrile rubber, polyvinyl alcohol or silicone.

3. The apparatus of claim 1 wherein said thermal conduction means comprises one or more thermal conductors.

4. The apparatus of claim 3 wherein said one or more thermal conductors comprises thermal conducting arms, struts, shafts, pins, plates, pads, mesh and combinations of two or more thereof.

5. The apparatus of claim 3 wherein said one or more thermal conductors comprises one or more heat pipes or thermosyphons.

6. An apparatus of claim 1 wherein said composite abuts or is in direct thermal contact with one or more temperature sensitive components.

7. A composite for cooling one or more temperature sensitive components, comprising:
    a sponge-like material and a liquid refrigerant;
    a containment material encasing said material and configured to rupture and release evaporated refrigerant therethrough at a preselected temperature or pressure; and
    a thermal conductor configured to contact the temperature sensitive components for directing thermal energy therebetween.

8. The composite of claim 7, wherein the refrigerant comprises water, aqueous solutions, alcohols, amines or fluorocarbons.

9. The composite of claim 7, wherein the sponge-like material comprises natural sponge, sponge rubber, polyurethane, polyolefin, vinyl nitrile rubber, polyvinyl alcohol or silicone.

10. The composite of claim 7, wherein the components comprise electrical components.

11. The composite of claim 7, wherein the containment material comprises one or more of a natural resin, polymer, epoxy resin, phenolic resin, neoprene or vinyl polymer.

* * * * *